(12) United States Patent
Kim et al.

(10) Patent No.: US 8,305,804 B2
(45) Date of Patent: Nov. 6, 2012

(54) FLASH MEMORY DEVICE AND SYSTEM INCLUDING THE SAME

(75) Inventors: Jong-Hwa Kim, Hwaseong-si (KR); Young-Joon Choi, Seongnam-si (KR); Seok-Cheon Kwon, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/067,746

(22) Filed: Jun. 23, 2011

(65) Prior Publication Data

US 2011/0255338 A1    Oct. 20, 2011

Related U.S. Application Data

(63) Continuation of application No. 12/457,416, filed on Jun. 10, 2009, now Pat. No. 7,995,393.

(30) Foreign Application Priority Data

Jun. 23, 2008 (KR) ......................... 10-2008-0059067

(51) Int. Cl.
*G11C 11/40* (2006.01)

(52) U.S. Cl. ............... 365/185.02; 365/201; 365/185.19; 365/185.24; 365/185.12

(58) Field of Classification Search ............ 365/185.24, 365/185.02, 185.19, 185.12
See application file for complete search history.

(56) References Cited

U.S. PATENT DOCUMENTS

| 7,023,737 | B1 * | 4/2006 | Wan et al. ................. 365/185.22 |
| 7,305,596 | B2 | 12/2007 | Noda et al. |
| 7,352,630 | B2 | 4/2008 | Lee et al. |
| 2006/0026489 | A1 | 2/2006 | Noda et al. |
| 2006/0274564 | A1 * | 12/2006 | Kim ............................. 365/100 |
| 2007/0025159 | A1 | 2/2007 | Lee et al. |
| 2007/0253256 | A1 * | 11/2007 | Aritome ................... 365/185.24 |
| 2008/0266970 | A1 * | 10/2008 | Lee et al. ................. 365/185.19 |

FOREIGN PATENT DOCUMENTS

| JP | 2004-225571 | 2/2006 |
| KR | 10-0280474 | 11/1999 |
| KR | 10-0648290 | 11/2006 |

OTHER PUBLICATIONS

An English language abstract of Korean Publication No. KR 10-0280474, published Nov. 10, 2000.

\* cited by examiner

*Primary Examiner* — Hoai V Ho
*Assistant Examiner* — Jay Radke
(74) *Attorney, Agent, or Firm* — Harness, Dickey & Pierce, P.L.C.

(57) ABSTRACT

The invention provides an operation method of a memory system including a flash memory device. The method includes programming at least one page included in a selected memory block of the flash memory device; and determining the selected memory block or the flash memory device to be invalid, according to whether a loop number of the programmed page is out of a reference loop range.

21 Claims, 19 Drawing Sheets

<SLC>

<MLC>

{ —— : Normal distribution
{ --- : Disturbed distribution

Fig. 12

| Block No. | Page No. | Loop No. | |
|---|---|---|---|
| BLK0 | P0 | 4 | ΔDistribution : 5 |
| | P1 | 5 | |
| | P2 | 3 | |
| | P3 | 6 | |
| | P4 | 4 | |
| | ⋮ | ⋮ | |
| | Pm-2 | 1 | |
| | Pm-1 | 2 | |
| BLK1 | P0 | 1 | ΔDistribution : 3 |
| | P1 | 2 | |
| | P2 | 4 | |
| | P3 | 3 | |
| | P4 | 2 | |
| | P5 | 3 | |

FLASH MEMORY DEVICE AND SYSTEM INCLUDING THE SAME

PRIORITY STATEMENT

This U.S. nonprovisional application is a continuation of U.S. application Ser. No. 12/457,416, filed Jun. 10, 2009 now U.S. Pat. No. 7,995,393, which claims priority under 35 U.S.C §119 to Korean Patent Application No. 2008-59067, filed on Jun. 23, 2008, in the Korean Intellectual Property Office, the entire contents of each of which are incorporated by reference.

BACKGROUND

1. Technical Field

The present invention relates to a semiconductor memory device, more particularly, the present invention relates to a flash memory device and a system including the same.

2. Description of Related Art

A flow chart for describing a programming method of a conventional nonvolatile memory device is depicted in FIG. 1. FIG. 2 shows threshold voltage distributions of a nonvolatile memory device which stores 1-bit data and 2-bit data per cell. A typical programming method of a nonvolatile memory device will be described below with reference to FIG. 1 and FIG. 2.

Once a programming operation is initiated, data to-be-programmed is loaded in the nonvolatile memory device in S1. On completion of loading of data to-be-programmed, the loaded data is programmed in a memory cell array of the nonvolatile memory device in a well-known programming method, in S2. In S3, a verification reading operation is performed to determine whether the programmed memory cells have the required threshold voltage. The data read in accordance with the verification reading operation is temporarily stored in a register. In S4, the data stored in the register is sequentially selected in a predetermined or reference unit, and the selected data is mounted in an internal data bus. This operation is referred to as a "column scan operation". In S5, it is determined whether the data bits in the predetermined or reference unit that are mounted in the internal data bus have a program fail data value. That is to say, it is determined whether the programming operations are successfully carried out or not. In case at least one of the data bits of the predetermined or reference unit that are mounted on the internal data bus have a program fail data value, it is determined, in S6, whether the present program loop is a maximum program loop. If the present program loop is not the maximum program loop, the process is moved back to S2. If the present program loop is the maximum program loop, the programming operation is processed as a program fail and the programming process is ended. Going back to S5, if the data bits of the predetermined or reference unit mounted on the internal data bus all have the program pass data value, in S8, the programming operation is processed as a program pass and the program process is ended.

As can be seen from the above description, the programming operation is performed by a plurality of program loops, each of which includes a program interval corresponding to S2 and a program verification interval corresponding to S3 to S5. The program loops are performed repeatedly for the maximum program loop number until the selected memory cells are programmed entirely. As is well known in the art, a program voltage will be incremented for a predetermined or reference increment when the program loops are repeated. In other words, the programming operation will be performed using the Incremental Step Pulse Program (ISPP) scheme. Even in case a portion (e.g. one data bit) of the data bits to-be-programmed is not programmed, the program loops will be repeated up to a maximum program loop number. Since a program voltage increases as the program loops number increases, memory cells supplied with high voltages (e.g. program voltage, pass voltage) may be overly programmed. In other words, a program disturbance and/or a pass voltage disturbance may occur. This may cause widening of a threshold voltage distribution and/or transfer of the threshold voltage distribution as is shown in FIG. 2. Even in case a programming operation is determined as a program pass, over-programming of the memory cells may cause read error due to the widening of a threshold voltage distribution and/or the transfer of the threshold voltage distribution. As a result, there may occur a device fail indicating that a nonvolatile memory device cannot be used.

SUMMARY

Exemplary embodiments of the present invention are related to a flash memory device, method of operating and a system including the same.

In an exemplary embodiment, a method of operating a memory system including a flash memory device comprises: programming at least one page included in a selected memory block of the flash memory device; and determining the selected memory block or the flash memory device to be invalid, according to whether a loop number of the programmed page is out of a reference loop range.

In another exemplary embodiment, a method of operating a memory system including a flash memory device is provided which comprises reading wear-leveling information from the flash memory device upon power-up; and setting the flash memory device up to the starting level of the program voltage determined in accordance with the wear-leveling information.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 12 illustrates a relation between respective pages and loop numbers thereof according to exemplary embodiments of the present invention.

DETAILED DESCRIPTION OF THE EMBODIMENTS

Figure 1:
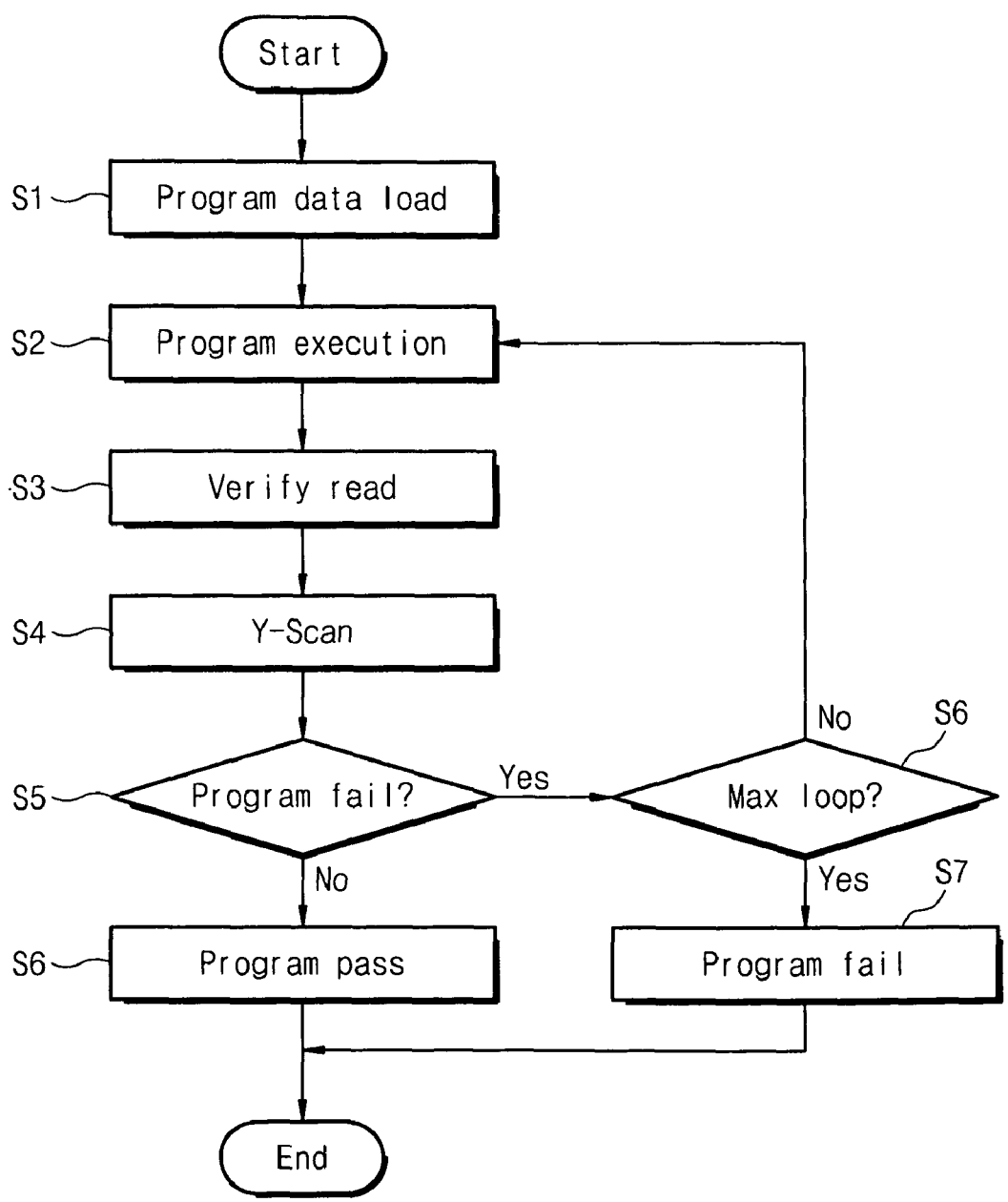
FIG. 1 is a flow chart which shows a programming method of a typical nonvolatile memory device.
Figure 2:
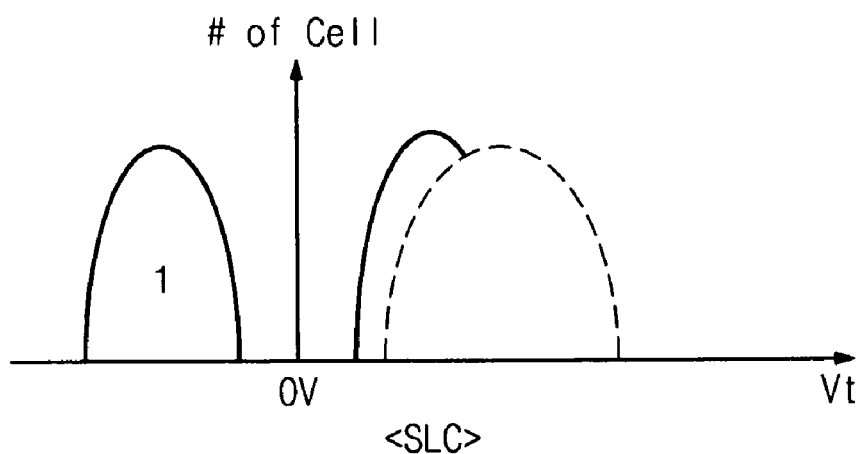
FIG. 2 depicts threshold voltage distributions of nonvolatile memory devices that store 1-bit data and 2-bit data per cell, respectively.
Figure 2:
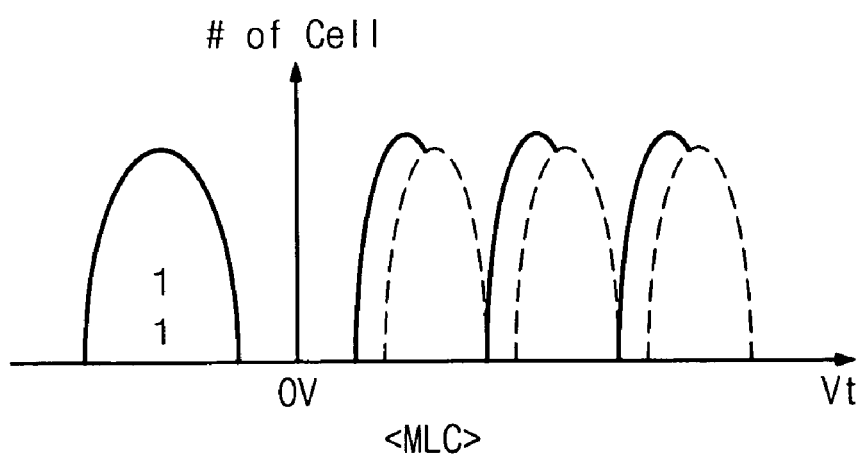

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements should be interpreted in a like fashion (e.g., "between" versus "directly between", "adjacent" versus "directly adjacent", etc.).

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The memory system according to exemplary embodiments of the present invention is configured to prevent device fail by decreasing over-programming of the memory cells due to repetitive supply of a program voltage and/or a pass voltage (will be referred to as 'over-programming phenomenon', hereinafter). More specifically, the over-programming phenomenon causes the data read from memory cells, programming operations of which are successfully completed, to be detected as read error data. The over-programming phenomenon of the memory cells may occur from various causes. For example, memory cells having relatively rapid programming speed may be over-programmed due to memory cells having relatively slow programming speed. In addition, charge may be trapped in an oxide layer of each memory cell due to Program/Erase cycling (PE cycling), and as a result, a threshold voltage of a memory cell may increase to be higher than an expected threshold voltage. This increase of the threshold voltage may cause the memory cells to be over-programmed as the program loops are repeated.

Example embodiments of the present invention are configured to perform a function of adjusting an initial level of a program voltage in accordance with a degree of wear count information (e.g., PE cycling number), a function of adjusting a target loop number of each memory block/page/chip in accordance with the wear-leveling information (e.g. number of PE cycles), a function of processing each of the memory blocks as bad blocks at an initial stage in accordance with the loop number distribution for each memory block, a function of processing each of the memory blocks as bad blocks at an initial stage in accordance with the loop number of each memory block, and/or a selected combination of these functions. This will be described in detail below. By using one of these functions or a selected combination of these functions, it will be possible to prevent a device fail that may occur from the memory cells being over-programmed.

Figure 3:
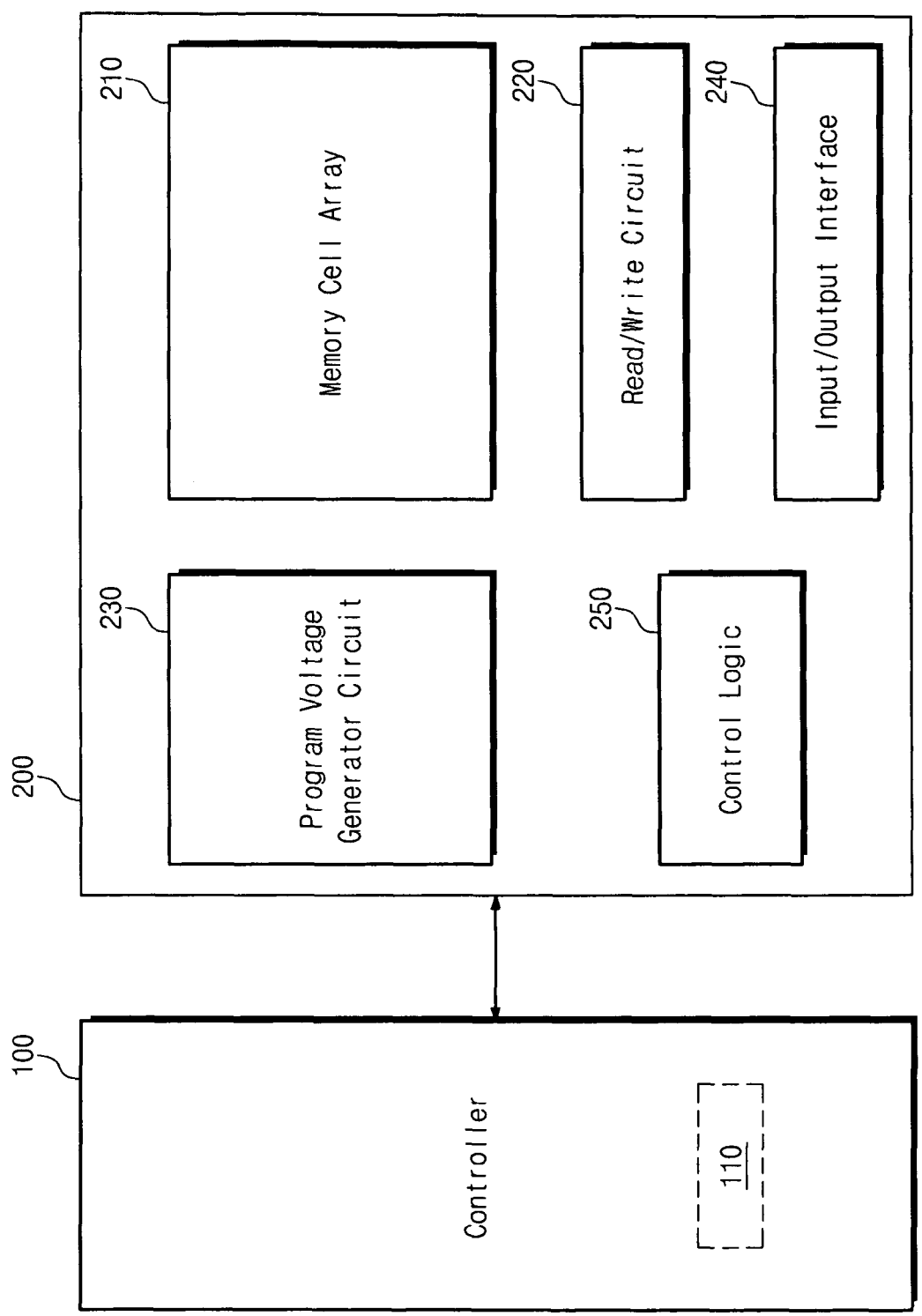
FIG. 3 briefly depicts a memory system according to an exemplary embodiment of the present invention.
Figure 4:
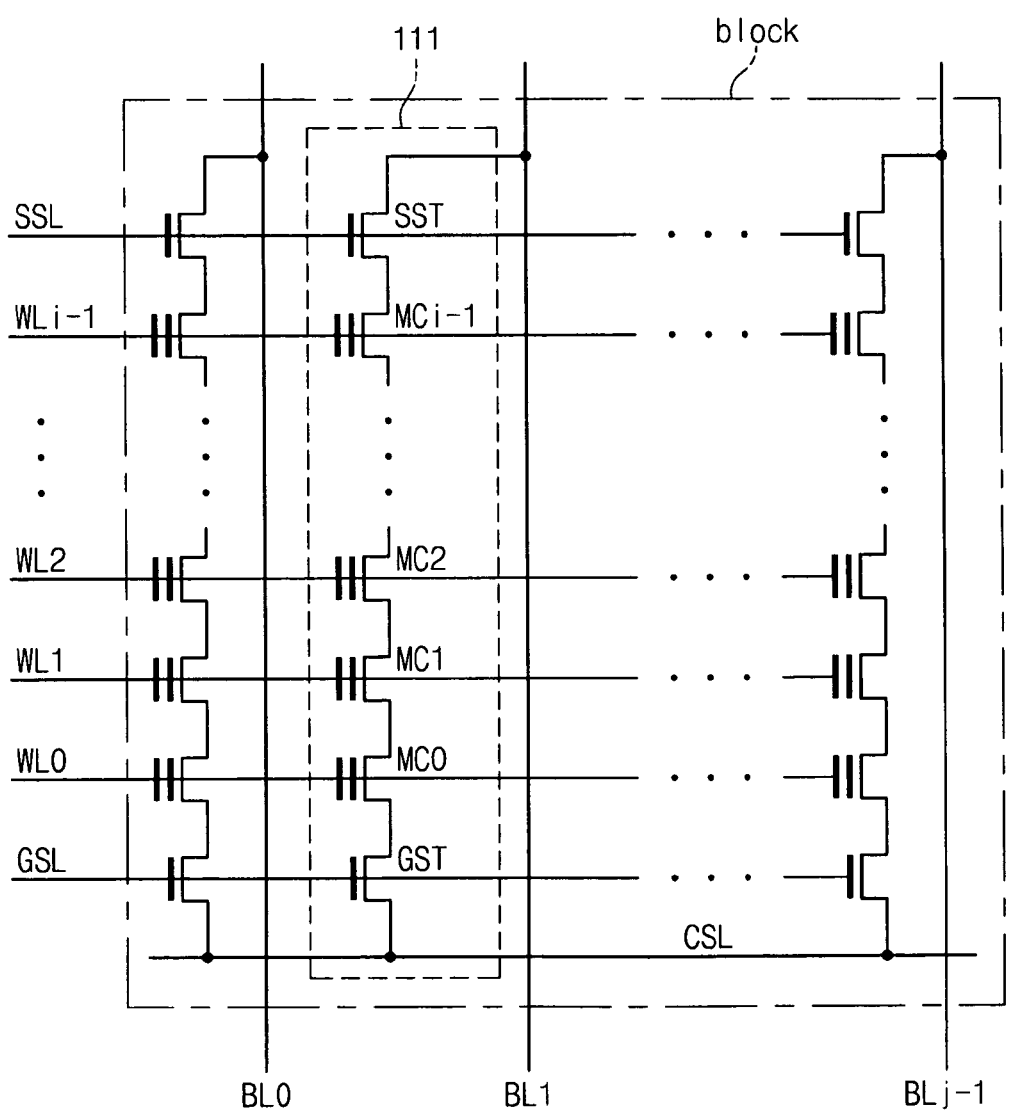
FIG. 4 is a circuit diagram depicting a portion of the memory cell array shown in FIG. 3.

FIG. 3 is a schematic block diagram depicting a memory system according to an exemplary embodiment of the present invention. FIG. 4 is a circuit diagram illustrating a portion of the memory cell array of FIG. 3.

Referring to FIG. 3, the memory system according to an exemplary embodiment of the present invention may include a memory controller 100 and a flash memory device 200. Only one flash memory device 200 is depicted in FIG. 3. However, the memory system may be realized so that a plurality of flash memory devices may be controlled by one memory controller 100. The memory controller 100 may control the flash memory device 200 in response to a request from an external device (e.g. a host). The memory controller 100 is configured so as to manage wear-leveling information (or, PE cycling number information) of the flash memory device 200. This wear-leveling information may be stored in a memory 110. The memory 110 may be a random access memory, for example, a DRAM or an SRAM. The memory 110 may include one or more memories. The wear-leveling information stored in the memory 110 may be restored or backed-up (or stored) in the flash memory device 200 as required. The memory controller 100 may control the flash memory device 200 so that a starting level of the program voltage of the flash memory device 200 or the program voltage of each memory block of the flash memory block 200 may be adjusted, based on the wear-leveling information. Alternatively, the memory controller 100 may control the flash memory device 200 so that a program loop number (referred to as a 'target loop number', hereinafter) of the flash memory device 200, or each memory block of the flash memory device 200, may be adjusted based on the wear-leveling information. Or, the memory controller 100 may control the flash memory device 200 so that each of the memory blocks is processed as a bad block at an initial stage according to whether the loop number distribution of the flash memory device 200 or memory blocks of the flash memory device 200 is over a reference distribution. The memory controller 100 may control the flash memory device 200 so that a memory block is processed as a bad block at an initial stage according to a program loop number of the page/memory block of which the programming operation is performed. The functions of the previously described memory controller 100 may be performed independently, or a selective combination of the functions may be performed. This will be described further in detail.

Referring on to FIG. 3, the flash memory device 200 may include a memory cell array 210, a read/write circuit 220, a program voltage generator circuit 230, an input/output interface 240, and a control logic 250. The memory cell array 210 may include memory cells arranged in cross-sections of rows (e.g. word lines) and columns (e.g. bit lines), and each of the memory cells may store 1-bit data and/or M-bit data (M is a positive number equal to 2 or larger). The memory cells may be arranged to form pluralities of memory blocks. In an exemplary embodiment, as shown in FIG. 4, the memory block may include a plurality of strings (or, NAND strings) 111. Each string 111 may be composed of a string selecting transistor SST connected to a string selecting line SSL, a ground selecting transistor GST connected to a ground selecting line GSL, and a plurality of memory cells MC0 to MCi−1 connected to word lines WL0 to WLi−1, respectively. Each string 111 may be connected between a corresponding bit line and a common source line CSL.

Referring back to FIG. 3, the read/write circuit 220 may be controlled by a control logic 250, and perform read/write operations on the memory cell array 210. For example, during a reading operation, the read/write circuit 220 reads data from the memory cell array 210, and outputs the read data to the memory controller 100 via an input/output interface 240. During a write operation, the read/write circuit 200 receives data from the memory controller 100 via the input/output interface 240, and stores the input data at the memory cell array 210. Here, the write operation may include typical erase and programming operations well-known in the art. The program voltage generator circuit 230 may operate in response to control of the control logic 250, and generate voltages required in the programming operation. The generated voltages may be supplied to the memory cell array 210 and/or read/write circuit 220. The control logic 250 may be configured so as to control the entire operation of the flash memory device 200.

Figure 5:
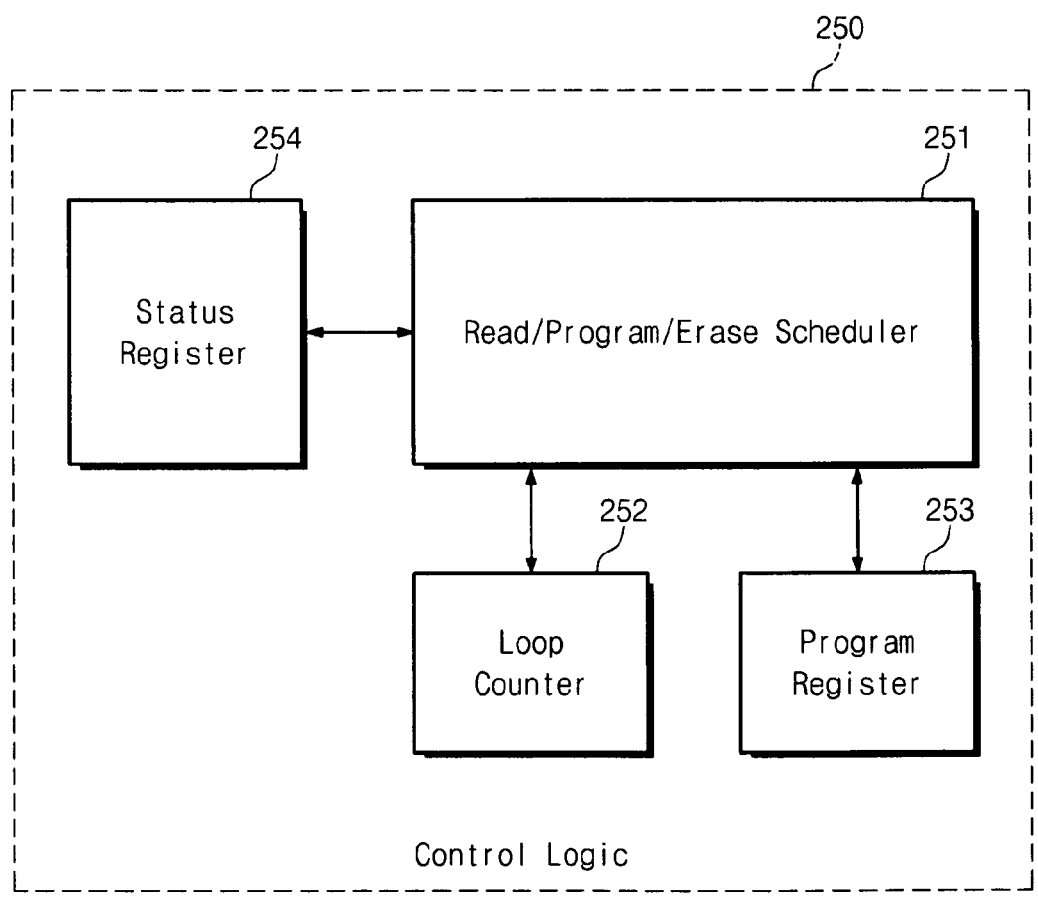
FIG. 5 is a block diagram depicting a control logic of FIG. 3 according to an exemplary embodiment of the present invention.

FIG. 5 is a schematic block diagram of the control logic depicted in FIG. 3 according to an exemplary embodiment of the present invention.

Referring to FIG. 5, the control logic 250 according to the present invention may include a read/program/erase scheduler 251, a loop counter 252, a program register 253, and a status register 254.

The read/program/erase scheduler 251 (will be referred to as 'scheduler', hereinafter) may be configured so as to control read, program, and erase operations of the flash memory device 200 in response to an input command. However, it will be obvious to a person having ordinary skill in the art that the function of the scheduler 251 is not limited to this. For example, when an access operation on the status register 254 is requested from an external device (e.g., a memory controller), the scheduler 251 may output the data stored in the status register 254 to the external device in response to the request. A program result, that is, information that indicates a program pass (status pass) or a program fail (status fail), information that indicates the last program loop number of the loop counter 252, and the like, is stored in the status register 254 under the control of the scheduler 251.

The loop counter 252 may count the program loop number based on the control of the scheduler 251. The program register 253 may be configured to store the program loop number according to the control of the scheduler 251. In the present invention, this program loop number may be the maximum loop number as the target loop number. In other words, the maximum loop number as the target loop number may be variable in the present invention. Also, the program register 253 may be configured to store information for determining a starting level of the program voltage to be generated by the program voltage generator circuit 230. The scheduler 251 may supply a step control code to the program voltage generator circuit 230 in accordance with the information for determining the starting level of the program voltage stored in the program register 253, during a programming operation. The step control code may increase/decrease depending on the repetition of the program loop under the control of the scheduler 251. Alternatively, the program register 253 may be configured to store wear-leveling information on the memory blocks included in the memory cell array 210.

Information indicating a target loop number, information for determining a starting level of a program voltage, and the like may be loaded to a program register 253 from a predetermined or reference area of the memory cell array 210, as trim information upon power-up. This information may be stored in a predetermined or reference area of the cell array 210 through testing. In the present invention, to decrease over-programming phenomenon, the information stored in the program register 253 may be varied according to a request from an external device (e.g. memory controller). This will be described below in detail.

In exemplary embodiment of the present invention, the data indicating a starting level of a program voltage stored in the program register, may be designated by various methods. For example, the starting level of the program voltage may be designated in a memory block unit or a chip unit. If the starting level of a program voltage is designated in chip units, the starting level of the program voltage may vary depending on the chip based on, for example, the average, max/min, or range of the PE cycling number. This may be managed in a table form by a memory controller 100. This table information, i.e., the information showing the relation between the average PE cycling number of the flash memory device and the starting level of the program voltage is stored in the flash memory device 200, and loaded in the memory 110 of the memory controller 100 upon power-up. In this case, a starting level of the program voltage may be designated as follows.

Figure 6A:
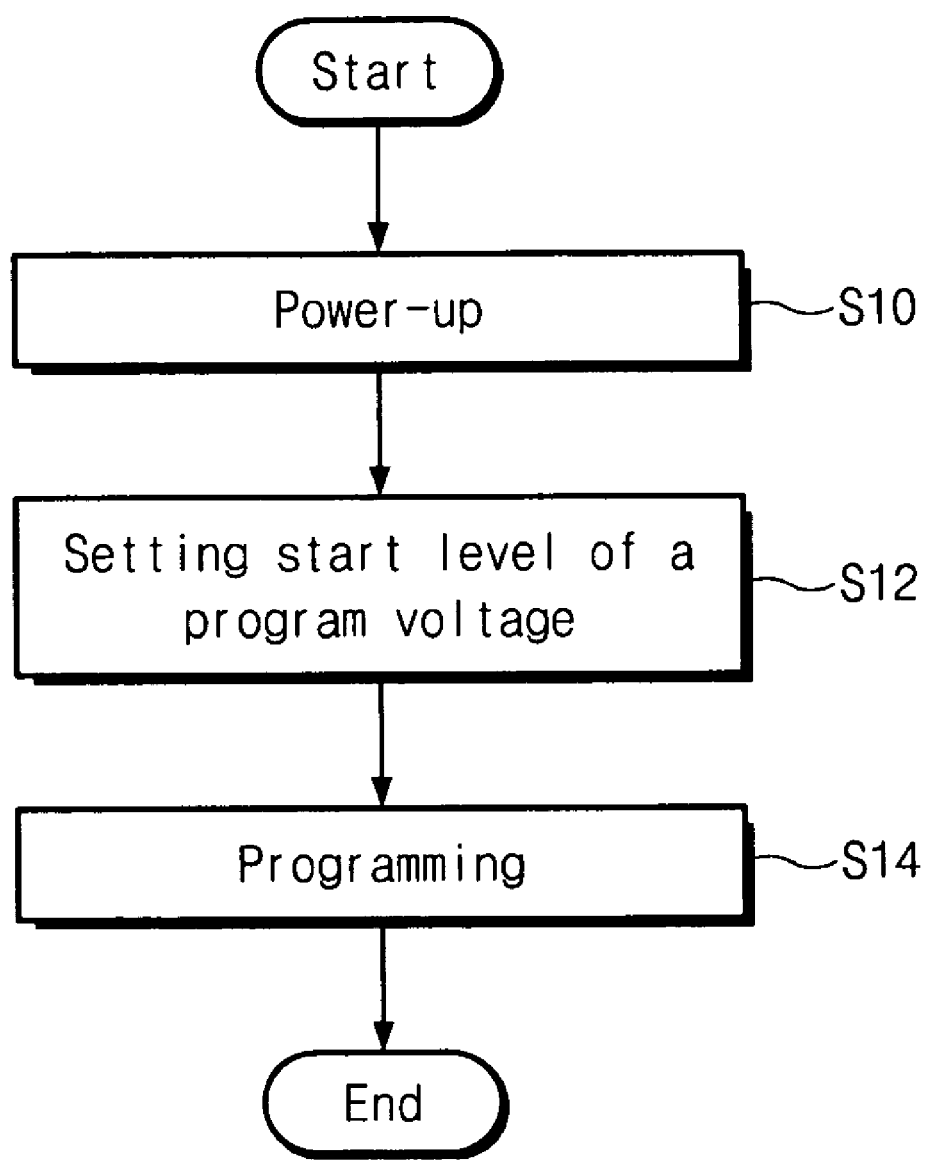
FIG. 6A and FIG. 6B are flow charts showing methods of designating starting levels of a program voltage of a memory system according to exemplary embodiments of the present invention.

Referring to FIG. 6A which shows a method of designating a starting level of a program voltage of the memory system in accordance with exemplary embodiment of the present invention, initially, in S10, the memory system may be powered. Upon power-up, table information, i.e., information showing a relationship between the average, or max/min, PE cycling number, or range, and a starting level of a program voltage may be loaded to the memory 110 of a memory controller 100. In S12, the memory controller 100 may designate the initiation level of the program voltage of the flash memory device 200 based on the loaded table information. Then, in S14, a programming operation requested from an external device (i.e., host) may be performed.

On the other hand, if a starting level of a program voltage is designated in units of memory blocks, the starting level of the program voltage may vary depending on a PE cycling number, or range, of each memory block. This may be managed in a table form by the memory controller 100. This table information, i.e., the information indicating the relationship between the average PE cycling number of times of each memory block and the starting level of the program voltage is stored in the flash memory device 200, and is loaded to the memory 110 of the memory controller 100, upon power-up. In this case, the starting level of the program voltage may be designated as follows.

Figure 6B:
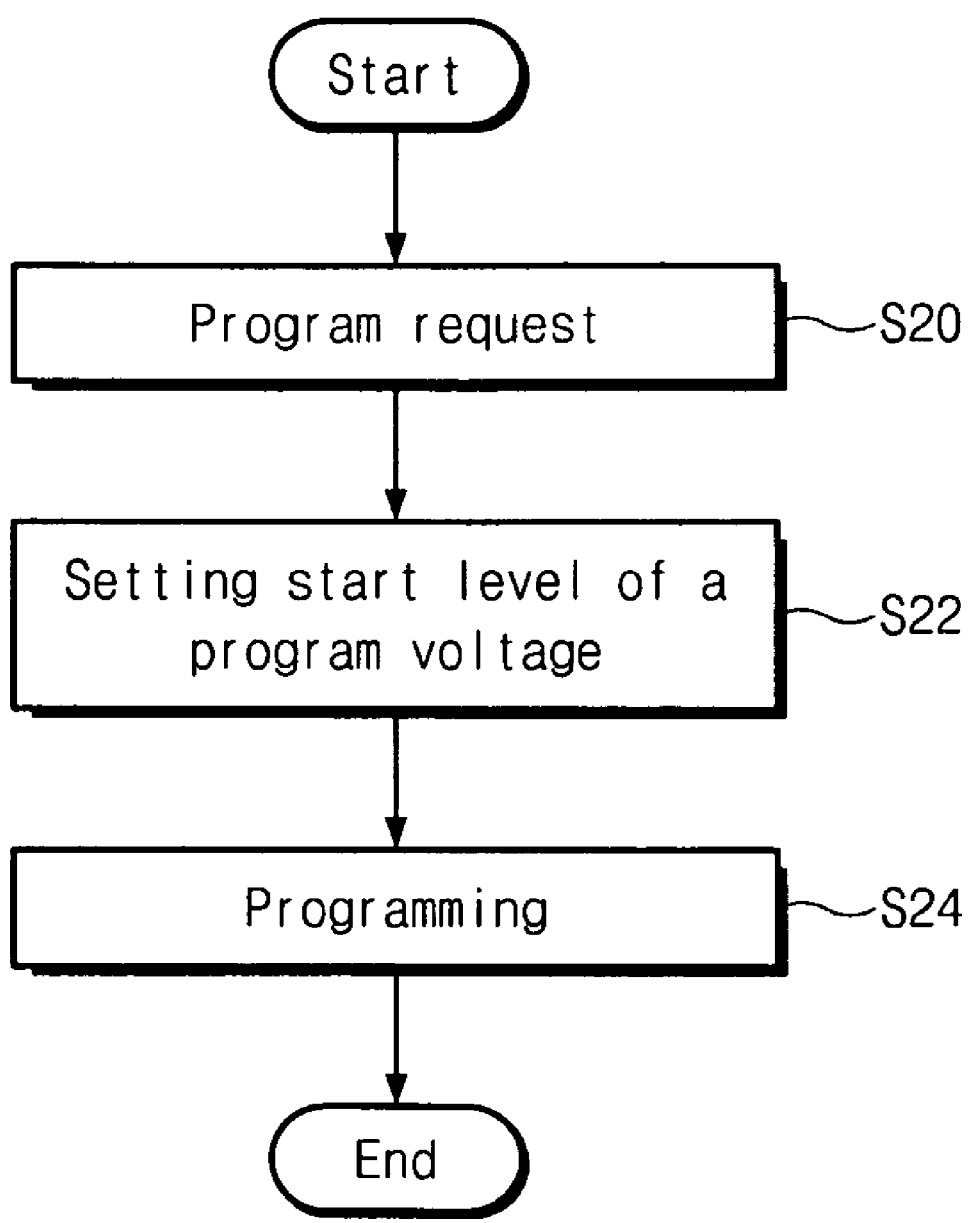

Referring to FIG. 6B which shows a method of designating a starting level of a program voltage of the memory system in accordance with another exemplary embodiment of the present invention, table information, i.e. the information showing the relationship between the PE cycling number, or range, of each memory block and the starting level of the program voltage may be loaded. Then, in S20, a programming operation may be requested from an external host. When the programming operation is requested, in S22, the memory controller 100 designates a starting level of a program voltage of the flash memory device 200 based on the table information stored in the memory 110 of the memory controller 100. The memory controller 100 transfers the data indicating the starting level of the program voltage corresponding to the memory block to-be-programmed. The flash memory device 200 stores the input data that shows the starting level of the program voltage in a program register 253. Then, in S24, the requested programming operation may be performed.

A starting level of a program voltage may also vary with reference to a loop number of a programmed page. For example, after a programming operation is completed, depending on whether the loop number read from the flash memory device is smaller than a predetermined or reference loop number, the starting level of the program voltage of the flash memory device, or each memory block in the flash memory device, may be adjusted according to the control of the memory controller 100.

Figure 7:
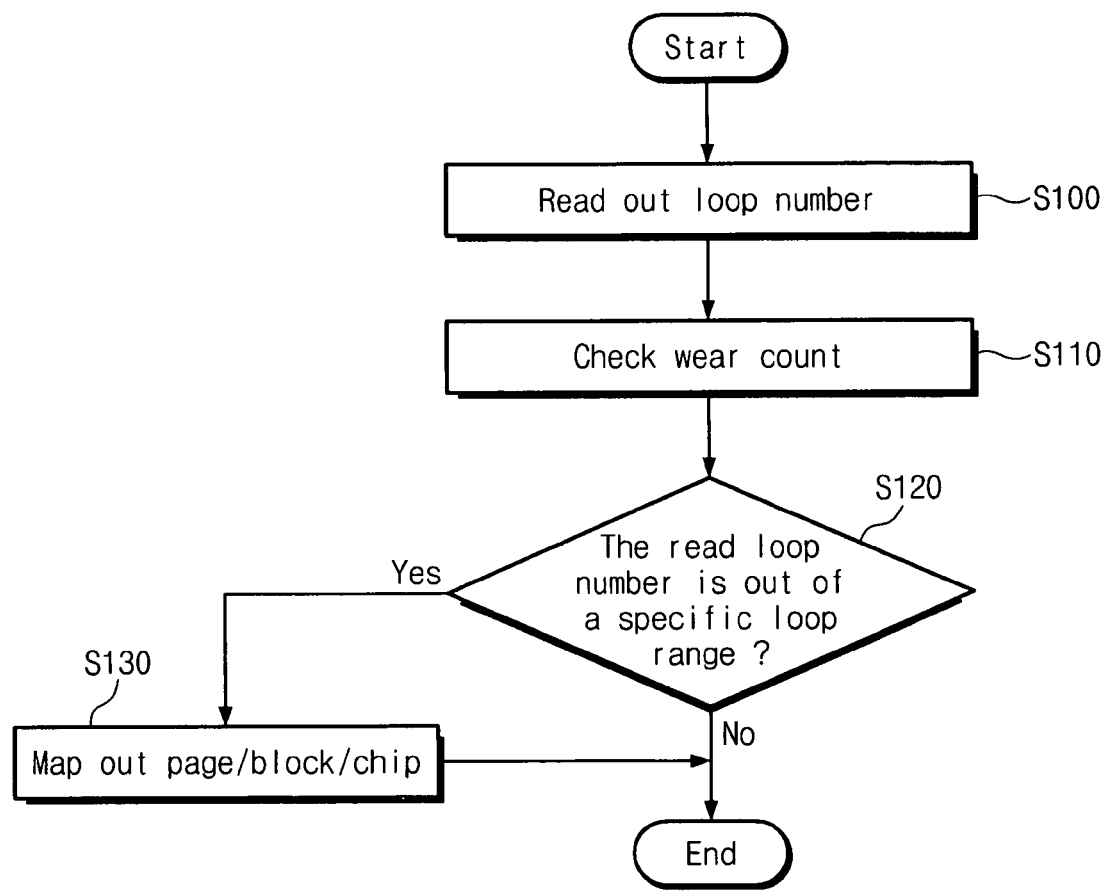
FIG. 7 is a flow chart showing a method of operating a memory system according to exemplary embodiments of the present invention.

FIG. 7 is a flow chart depicting an operation method of a memory system according to an exemplary embodiment of the present invention.

A memory controller 100 is configured to manage wear-leveling information of a flash memory device 200. In an exemplary embodiment, this means that erase count values (or, PE cycling values) on memory blocks of the flash memory device 200 are managed by the memory controller 100. These PE cycling values are stored in a memory cell array 210 of the flash memory device 200, and loaded to a memory 110 of the memory controller 100, upon power-up.

The memory system according to the present invention may be configured to read a loop number of a programmed page after a programming operation is completed. To prevent a device fail due to over-programming phenomenon, the memory system according to an exemplary embodiment of the present invention processes a memory block including a programmed page according to the read loop number, so as to be designated to a bad block.

In detail, as a person having ordinary skill in the art may understand, the number of program loops repeated during a programming operation is stored in a loop counter 252 of the flash memory device 200. When the programming operation is completed, in S100, the memory controller 100 outputs a command for reading a program loop number to the memory device 200. That is to say, in step S110, the memory controller 100 checks a PE cycling value of a programmed memory block stored in the memory 100.

In the memory 110, a PE cycling value or, PE cycling range and its corresponding predetermined or reference loop numbers or, loop range, for example, a lower loop number and an upper loop number, is stored and managed by the memory controller 100.

In step S120, the memory controller 100 may determine whether the read loop number is lower than a lower loop number or higher than an upper loop number, the loop number corresponding to the checked PE cycling value. In other words, the memory controller 100 may determine whether the read loop number is lower or higher than the reference loop range defined by the lower and upper numbers. If the read loop number is detected to be lower than the lower loop number that corresponds to the checked PE cycling value, or detected to be higher than the upper loop number that corresponds to the checked PE cycling value, the procedure is moved on to S130. In S130, the memory controller 100 processes a programmed memory block into a bad block. On the other hand, if the read loop number is detected to be higher than the lower loop number corresponding to the checked PE cycling value, and detected to be lower than the upper loop number corresponding to the checked PE cycling value, the procedure is ended.

In an exemplary embodiment, a low loop number of a programmed memory block, or a programmed page, means that the memory cells of a programmed page are programmed rapidly. For that reason, the memory cells may be over-programmed due to a pass voltage disturbance during a programming operation on other pages. A high loop number of a programmed memory block, or a programmed page, means that the memory cells of a programmed page are programmed slowly. This means that memory cells of other pages may be over-programmed due to a pass voltage disturbance during a programming operation of the memory cells having a slow programming characteristic. Alternatively, memory cells connected to a common row may be over-programmed due to program disturbance resulting from repeated programming operations of memory cells having slow programming characteristics. By removing a page that may cause over-programming or a memory block including the same at an early stage, it is possible to prevent a device fail.

In an exemplary embodiment, the operation of reading number of loops described with reference to FIG. 7 may be performed when an average or max/min PE cycling value exceeds a predetermined or reference PE cycling value, or after a predetermined or reference time period. The operation may also be performed without regard to the PE cycling value. However, it will be obvious to a person in the art that the present invention is not limited to the examples disclosed here.

Figure 8:
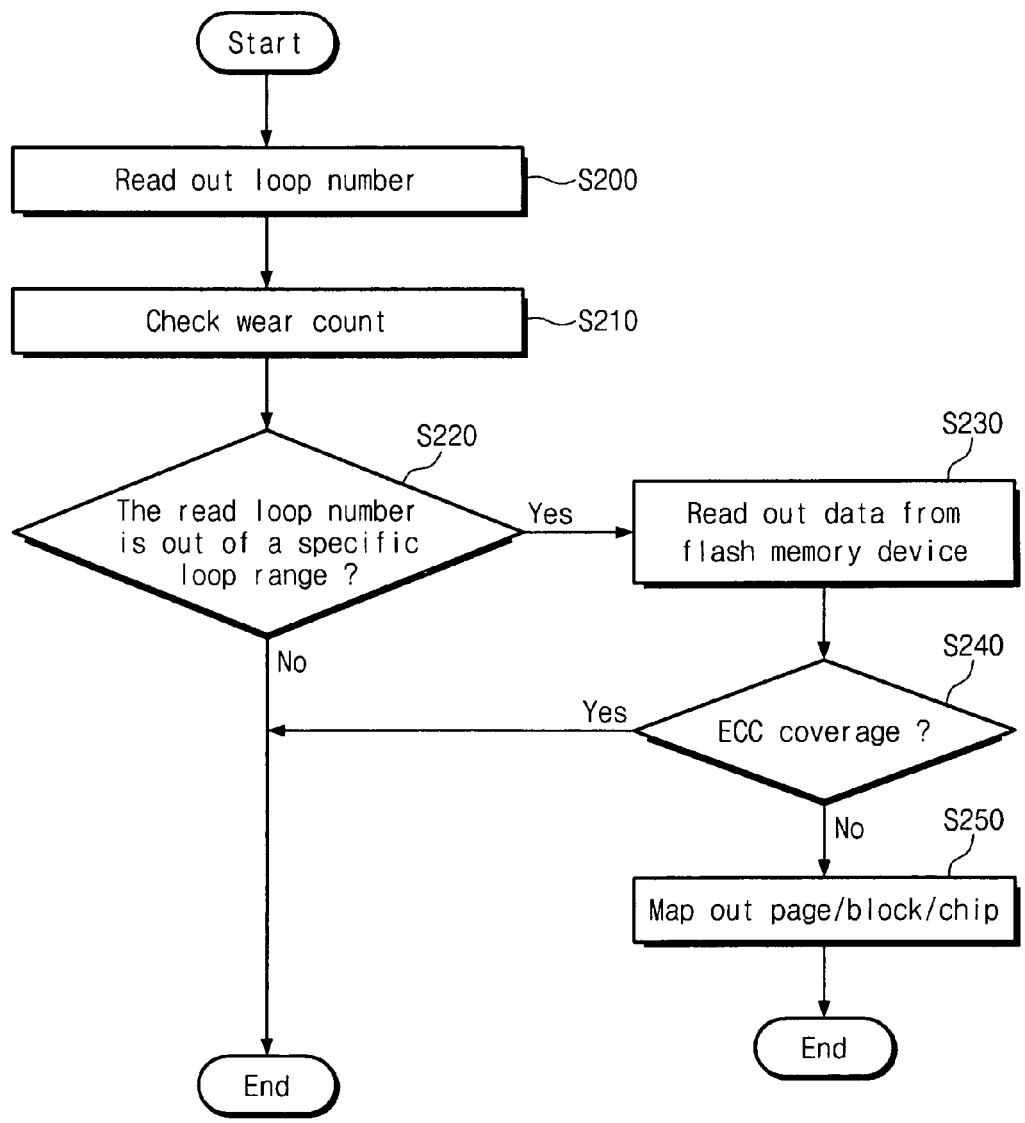
FIG. 8 is a flow chart depicting an operation method of a memory system according to other exemplary embodiments of the present invention.

FIG. 8 is a flow chart depicting an operation method of a memory system according to other exemplary embodiments of the present invention. In FIG. 8, the steps from step S200 to step S220 are identical with the steps S100 to S120, and the description thereof will be omitted.

Referring to S220, if the read loop number is detected to be less than the lower loop number corresponding to the checked PE cycling value, or if the read loop number is detected to be more than the upper loop number corresponding to the checked PE cycling value, the procedure is moved on to S230. In S230, the memory controller 100 controls the flash memory device 200 so that a reading operation on a programmed page is performed. In other words, data read from the programmed page may be outputted to the memory controller 100 in the flash memory device 200. In step S240, an error check and correction circuit (referred to as 'EEC circuit', hereinafter) of the memory controller 100 detects error from the outputted data, and determines whether the detected error is out of an error correction range f the ECC circuit. If the detected error is detected to be within the error correction range of the ECC circuit, the procedure is completed. On the other hand, if the detected error is out of the error correction range of the ECC circuit, the procedure is moved on to S250. In S250, the memory controller 100 may process a program page or a memory block including the same as a bad block.

In an exemplary embodiment, the operation described above may be performed in a chip unit or a page unit. When the read loop number does not go out of a reference loop range, and when the read loop number is lower than the lower loop number, the starting level of the program voltage may be adjusted according to the above-described method under the control of the memory controller 100.

Memory cells that are programmed slowly require repetition of program loops, which may cause an over-programming phenomenon of the memory cells that are programmed rapidly. Memory cells programmed rapidly may be over-programmed due to a program disturbance or a pass voltage disturbance during programming operations of other memory cells. Accordingly, a page having a program loop number that is out of a predetermined or reference loop range, based on lower and upper loop numbers, and a memory block including the same may cause a device fail later on. A device fail may be prevented by processing such page, or a memory block including the same, at an early stage as bad.

Figure 9:
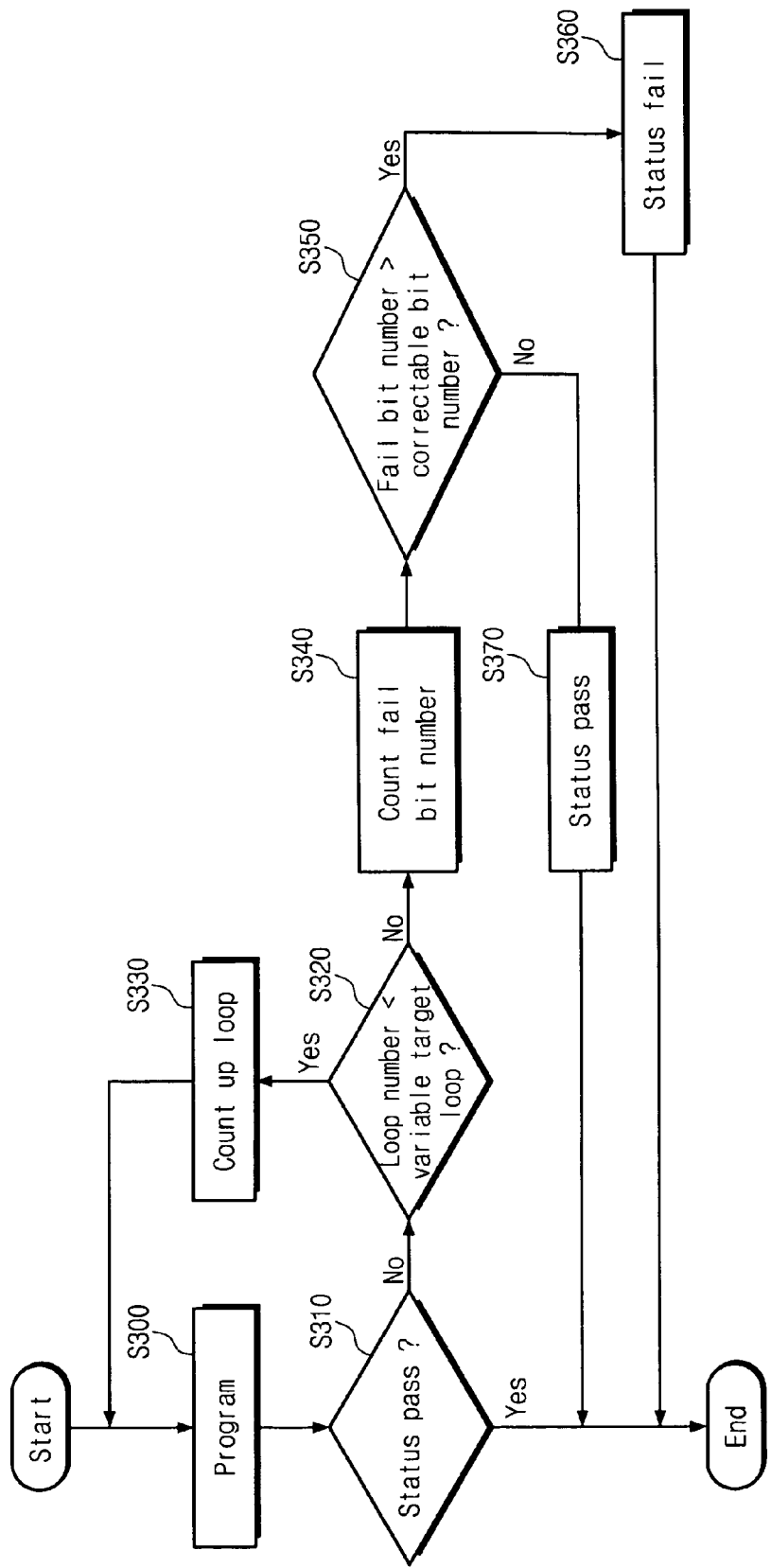
FIG. 9 is a flow chart of a programming method of a flash memory device according to other exemplary embodiments.

FIG. 9 is a flow chart of a programming method of a flash memory device according to other exemplary embodiments.

Before describing a programming operation, according to an exemplary embodiment of the present invention, it should be understood that a target loop number is stored in a program register 253 of a control logic 250, and a target loop number may be varied according to the control of a memory controller 100. For example, a target loop number may be stored in the program register 253 according to the control of the memory controller 100, upon power-up or before each programming operation is performed.

Data to-be-programmed is loaded to a read/write circuit 220 via an input/output interface 240, and, in S300, the loaded data may be programmed in a memory cell array 210 via the read/write circuit 220 under the control of the control logic 250. After a programming operation is performed, in S310, determination is made with regard to whether the programming operation is done successfully. It may be determined whether the programming operation is performed successfully through a verification reading operation and/or a column scan operation. During a verification reading operation, the read/write circuit 220 reads data from the programmed memory cells. During a column scan operation, the read/write circuit 220 selects the read data in a predetermined or reference unit and determines whether the selected data bits are program pass data. The detected result is transferred to the control logic 250. If at least one of the selected data bits is program fail data, in other words, if the detected result indicates a program fail, the control logic 250 controls the read/write circuit 220 so that the column scan operation may be stopped. If the data read from the programmed memory cells are all program pass data, the control logic 250 stores the status data indicating a program pass in a status register 254, and the procedure may be ended.

If at least one of the selected data bits is program fail data, in other words, if the detected result indicate a program fail, in step S320, the control logic 240, or scheduler 251, determines whether the loop count value of the loop counter 252 has reached a target loop number stored in the program register 253. If a loop count value of the loop counter 252 is detected not to reach a target loop number stored in the program register 253, in step S330, the loop count value of the loop counter 252 increases by 1 under the control of the scheduler 251. Then, the procedure is moved back to S300.

If a loop count value of the loop counter 252 is detected to have reached a target loop number stored in the program register 253, the procedure is moved on to S340. In S340, a failed bit number is counted. The read/write circuit 220 counts the number of fail bits of last selected data (the data that caused program fail) and unselected data among the data read by a verification reading operation. Then, in S350, the control logic 252 detects whether the counted fail bit number exceeds the number of error bits the memory controller 100 is capable of correcting. If the counted fail bit number is detected not to exceed the number of error bits the memory controller 100 is capable of correcting, in S370, the programming operation is ended as a program pass. If the counted fail bit number is detected to exceed number of error bits the memory controller 100 is capable of correcting, in S360, the programming operation is ended as a program fail.

An exemplary embodiment of an operation of counting the above-described fail bit number and a circuit thereof is disclosed in a U.S. Pat. No. 7,352,630, the entire contents of which are incorporated by reference.

A target loop number stored in a program register 253 of a control logic 250 may be designated by various methods. For example, a target loop number may be designated in a memory block unit or a chip unit. If the target loop number is designated in a chip unit, the target loop number may be varied according to an average, or max/min, PE cycling number, or range, of a chip. A chip may be a flash memory device. This information is managed in a table form by the memory controller 100. This table information, which indicates a relation between the average PE cycling number of the flash memory device and the target loop number, is stored in the flash memory device 200 and is loaded in the memory 110 of the memory controller 100 upon power-up. The target loop number in this case may be designated as follows.

Figure 10A:
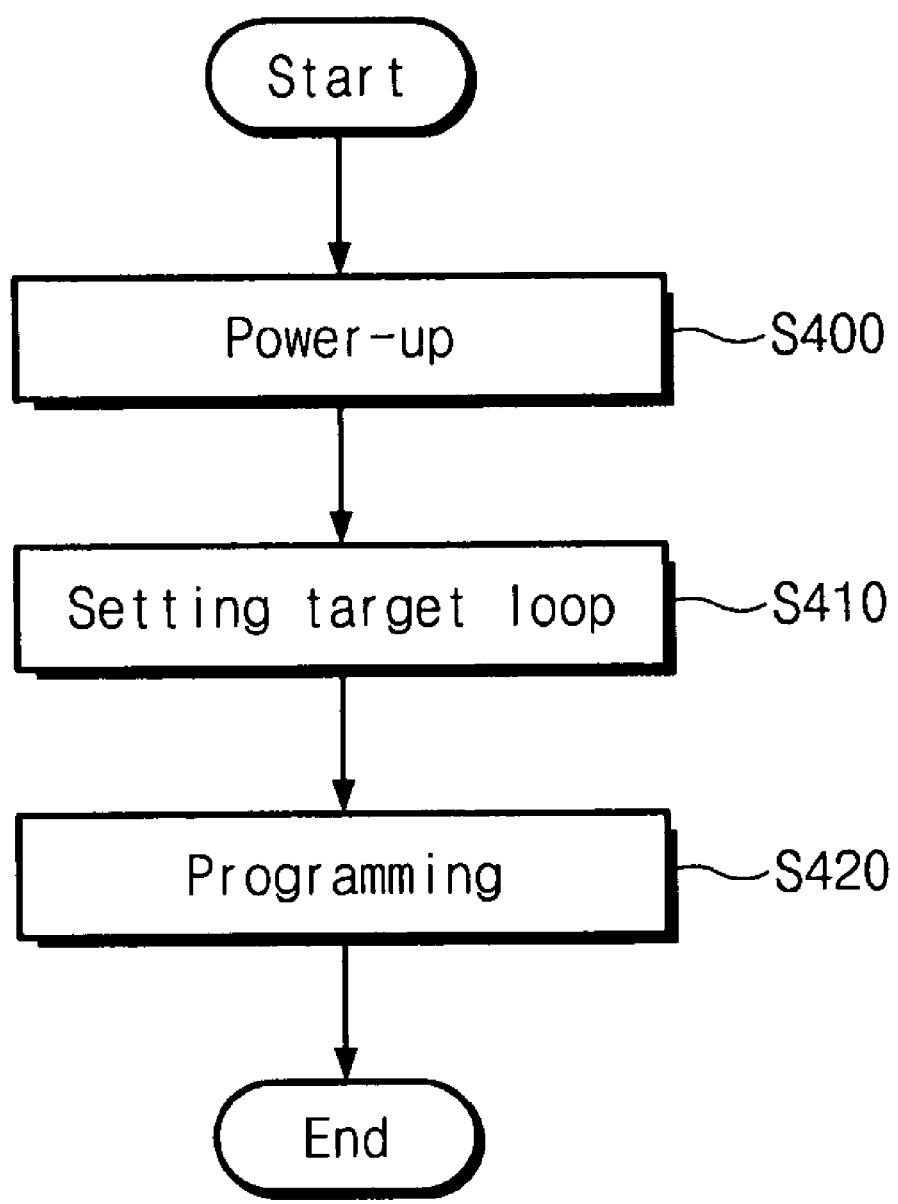
FIG. 10A and FIG. 10B are flow charts showing method of designating target number of loops of memory systems according to exemplary embodiments of the present invention.

FIG. 10A shows a method of designating a target loop number of a memory system according to exemplary embodiments of the present invention. Referring to FIG. 10A, first, in S400, the memory system is powered. Table information, which indicates a relation between the average PE cycling number of the flash memory device and the target loop number, is loaded from the flash memory device 200 to the memory 110 of the memory controller 100. In S410, the memory controller 100 designates a target loop number of the flash memory device 200 based on the loaded table information. Then, a programming operation requested from an external device (i.e. host) is performed. The programming operation may be performed in a method described with reference to FIG. 9, or in a method well-known in the art.

On the other hand, if the target loop number is designated in a memory block unit, the target loop number may vary depending on the PE cycling number, or range, of each memory block. This is managed in a table form by the memory controller 100. The table information is stored in the flash memory device 200, and is loaded to the memory 110 of the memory controller 100. In this case a target loop number is designated as follows.

Figure 10B:
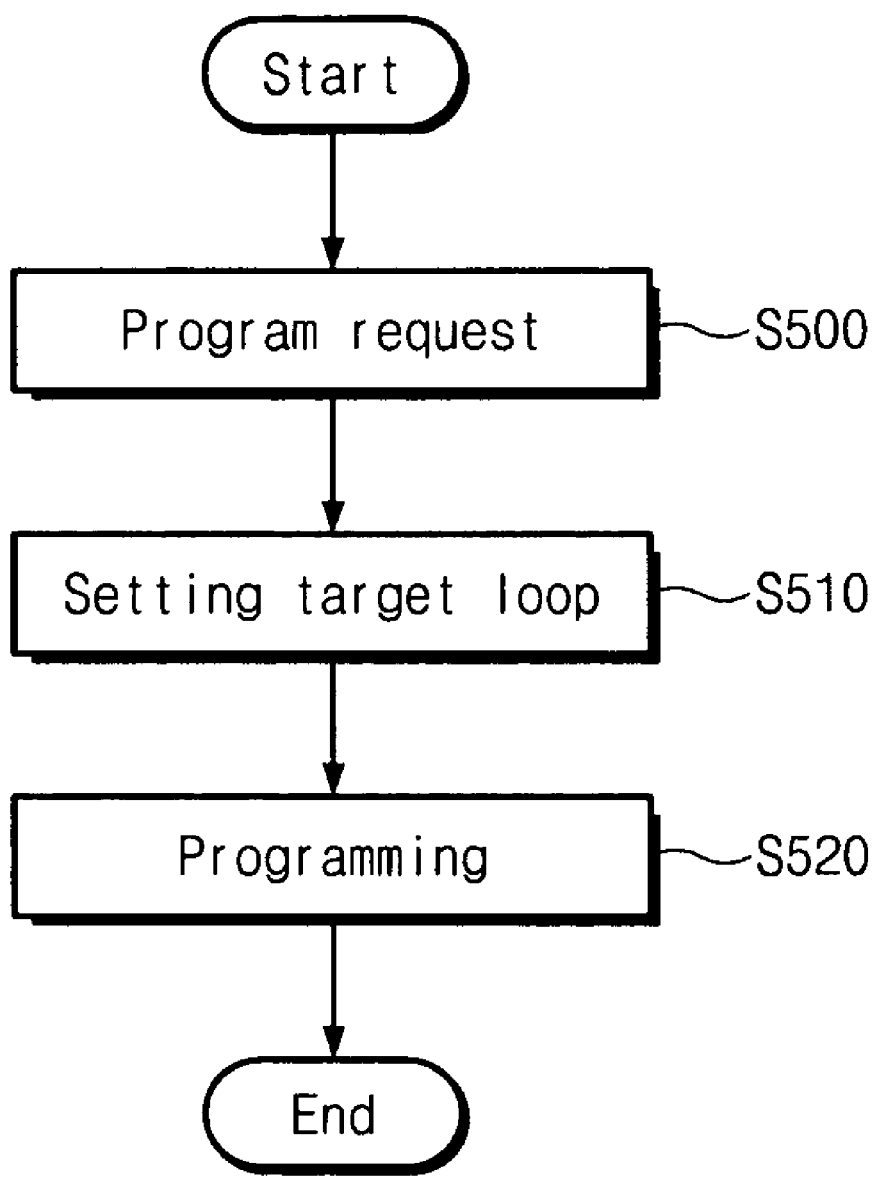

FIG. 10B shows a method of designating a target loop number of a memory system according to other exemplary embodiments of the present invention, upon power-up. Referring to FIG. 10B, the table information, which indicates a relation between the average PE cycling number of the flash memory device and the target loop number, is loaded from the flash memory device 200 to the memory 110 of the memory controller 100. After that, a programming operation is requested from an external device (e.g., a host). When a programming operation is requested, in S510, the memory controller 100 designates a target loop number of the flash memory device 200 based on the table information stored in the memory 110 of the memory controller 100. In other words, the memory controller 100 transfers a target loop number corresponding to a memory block to-be-programmed to the flash memory device 200, and the flash memory device 200 stores the inputted target loop number in a program register 253. Then, in S520, the requested programming operation is performed. The programming operation is performed in a method described with reference to FIG. 9, or in a method well-known in the art.

The target loop number may be designated without regard to an external device (e.g., a memory controller). For example, data indicating a PE cycling number of each memory block is loaded to the program register 253 of a control logic 250 upon power-up, and the target loop number may be designated based on address information of the accessed memory block.

In general, a program loop number decrements as the PE cycling number increments. This is because the threshold voltage increments due to a charge trap. Device fail due to over-programming may be prevented by adjusting the target loop number described above, or by adjusting a starting level of the program voltage. For example, the memory controller 100 manages in a table form, a relation between a PE cycling number, or range, of each page/memory block/chip and its corresponding starting level of the program voltage, and provides the starting level of the program voltage of each page/memory block/chip to the flash memory device 200 by using this table. In case the starting level of the program voltage is managed in a page/memory block unit, data indicating the starting level of the program voltage is provided to the flash memory device 200 every time the programming operation is requested. On the other hand, in case a starting level of the program voltage is managed in a chip unit, data indicating the starting level of the program voltage is provided to the flash memory device 200 upon power-up. Data provided to the flash memory device 200 is stored in the program register 253 of the control logic 250.

The flash memory device 200 may be constituted so as to manage the starting level of the program voltage on its own without interference of the memory controller 100. For example, a PE cycling number of each memory block/page may be stored in the program register 253 after power-up or before a program operation is done. When a programming operation on the memory block/page is requested, the control logic 250 provides data for determining a starting level to a program voltage generator circuit 230 based on the PE cycling information stored in the program register 253. The program voltage generator circuit 230 generates the program voltage determined according to the inputted data.

According to another exemplary embodiment of the present invention, it is possible to prevent device fail due to over-programming by managing a loop number distribution. This will be described further below.

Figure 11:
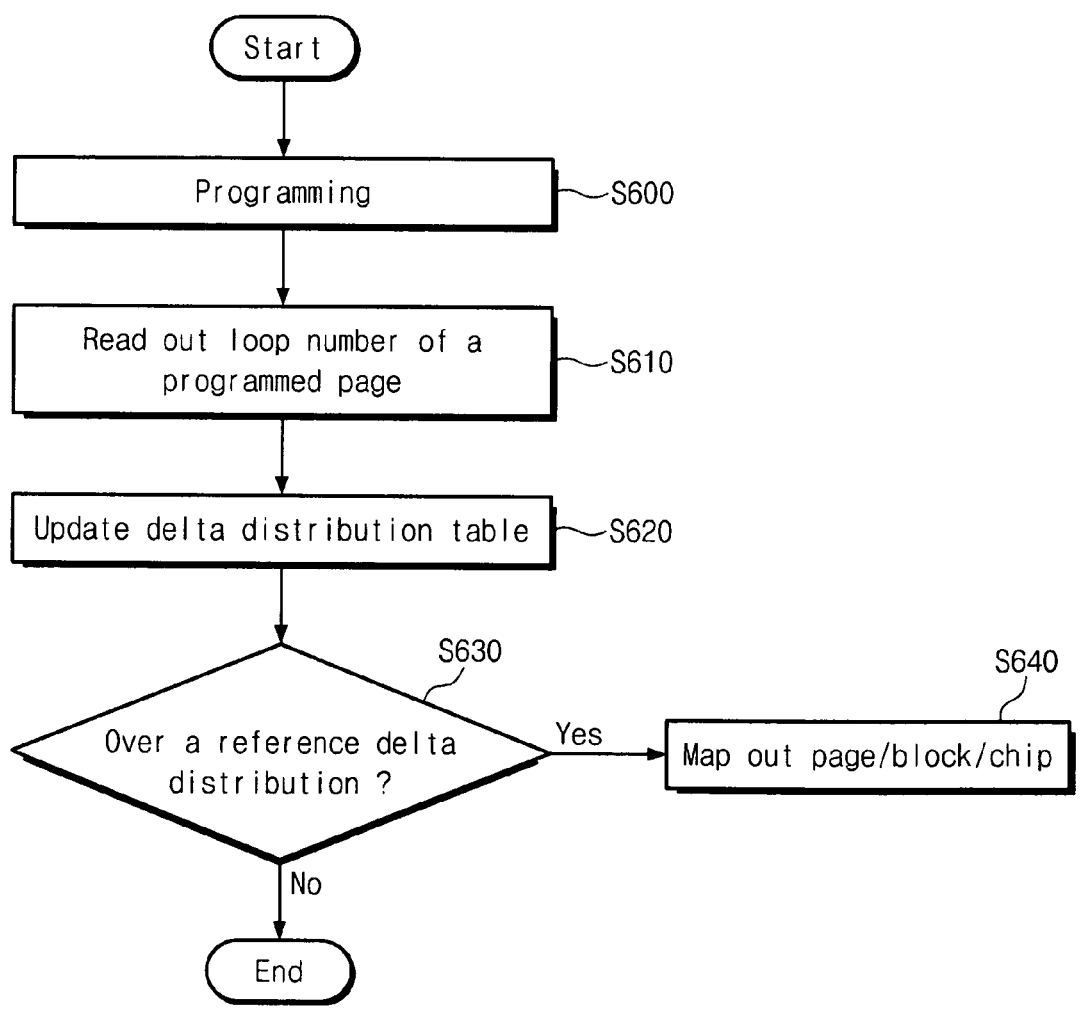
FIG. 11 is a flow chart depicting a method of operating a memory system according to other exemplary embodiments of the present invention.

FIG. 11 is a flow chart depicting a method of operating a memory system according to other exemplary embodiments of the present invention. FIG. 12 illustrates a relation between each page according to exemplary embodiments of the present invention and its loop number.

In S600, A programming operation on the flash memory device 200 is performed. When a programming operation is completed, in S610, the memory controller 100 reads a loop number of a programmed page from a flash memory device

200. S610 may be performed in the same manner as S100 described above with reference to FIG. 7. Therefore further description of S610 is omitted for brevity. The read loop number is managed in a table form by the memory controller 100, as shown in FIG. 12. This table is referred to as a 'delta distribution table'. As a loop number is read from the flash memory device 200, the delta distribution table is renewed by the memory controller 100 (S620). The delta distribution table is stored in a memory 110 of the memory controller 100, and is restored/backed-up in the flash memory device 200 when required. The delta distribution table stored in the flash memory device 200 is loaded to the memory 110 of the memory controller upon power-up.

In S630, the memory controller 100 determines whether the delta distribution value of each memory block exceeds a reference delta distribution value based on the delta distribution table. In other words, the memory controller 100 detects whether the delta distribution table includes a loop number exceeding a reference loop range as the reference delta distribution value. Here, a delta distribution value of each memory block means a difference between a minimum loop number and a maximum loop number. For example, referring to FIG. 12, a memory block BLK0 has a delta distribution value of '5' when it is assumed that the minimum loop number is '1' and the maximum loop number is '6'. Or, when it is assumed that the minimum loop number is '1' and the maximum loop number is '4', the memory block BLK1 has a delta distribution value of '3'. In an exemplary embodiment, assuming the reference delta distribution value is '3', because the delta distribution value of the memory block BLK0 exceeds the reference delta distribution value, the memory block BLK0 is processed as a bad block. If each delta distribution value is detected not to exceed the reference delta distribution value, the procedure is ended.

In an exemplary embodiment, the delta distribution table is renewed every time a program operation is completed. On the other hand, detecting whether the delta distribution value of each memory block exceeds the reference delta distribution value may be done at another stage.

In case the delta distribution value exceeds the reference delta distribution value, memory cells of a page having a small loop number (e.g., 1 or 2) may be over-programmed during a programming operation of a page having a large loop number (e.g., 5 or 6). As a device fail may be caused by such memory cells, it may be prevented by processing the memory blocks having such page at an early stage to be a bad block.

Figure 13:
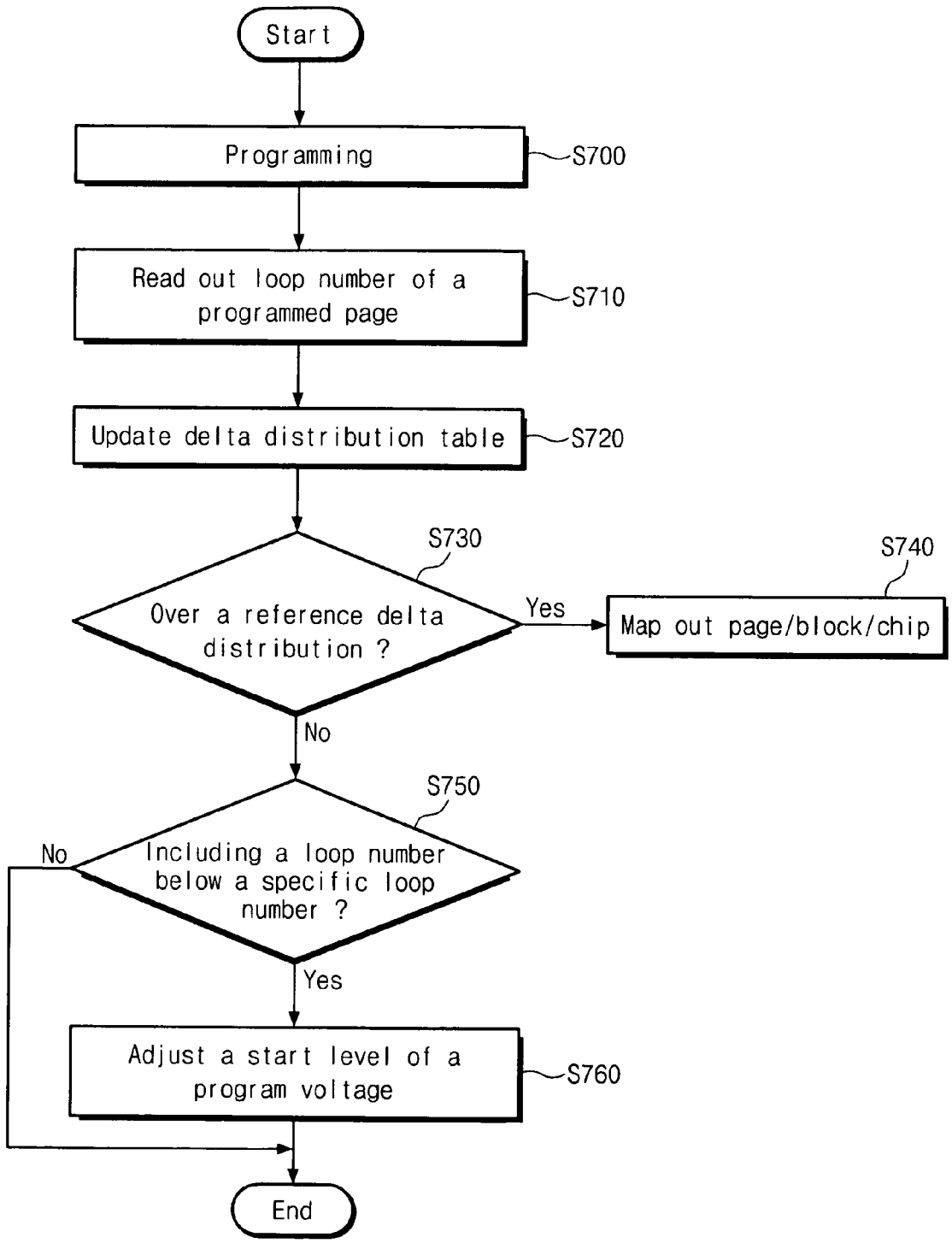
FIG. 13 is a flow chart showing an operating method of a memory system according to other exemplary embodiments of the present invention.

FIG. 13 is a flow chart depicting an operating method of memory systems according to other exemplary embodiments of the present invention. In FIG. 13, steps from S700 to S730 may be performed in the same manner as steps S600 to S630 depicted in FIG. 11. Thus further description of steps S700 to S730 is omitted for brevity.

Referring to S730, if each delta distribution value is detected not to exceed the reference delta distribution value, the procedure goes to S750. In S750, a memory controller 100 detects whether one or more pages include a loop number smaller than a predetermined or reference loop number (e.g., 1 or 2) based on the delta distribution table. Here, memory cells programmed within the predetermined or reference loop number suffer stresses when other pages are programmed which may result in the memory cells programmed within the predetermined or reference loop number being over-programmed. In other words, such memory cells may be programmed at a high speed. In S760, a starting level of a program voltage may be adjusted to prevent over-programming of the memory cells programmed within the predetermined or reference loop number. In other words, if there are one or more detected pages including a loop number smaller than the predetermined or reference loop number (e.g., 1 or 2), a starting level of the program voltage is adjusted in S760. This is performed in an identical way described above, therefore, the description is omitted.

Figure 14:
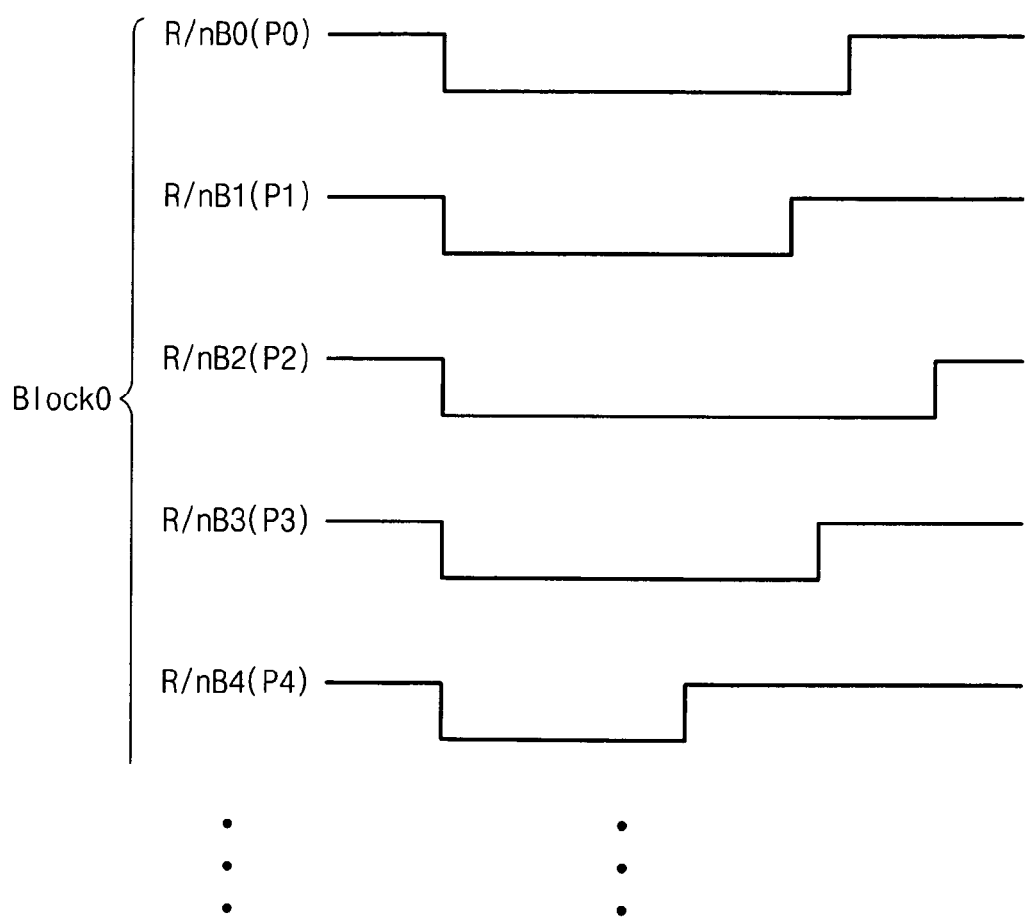
FIG. 14 is to illustrate a delta distribution table according to the operating method of the memory system of FIG. 13.

As described above, a delta distribution table is managed based on a loop number. However, it will be obvious to a person in the art that the present invention is not limited to this example. For example, while a programming operation is performed, as shown in FIG. 14, the memory controller 100 measures an activation time of a control signal of each page included in each memory block of the flash memory device 200, for example, R/nB0-R/nB4. The memory controller 100 constitutes a delta distribution table using times measured in the above way, and this delta distribution table may be used in the operating method described with reference to FIG. 11 and FIG. 13.

A flash memory device is a nonvolatile memory device capable of retaining data stored even at power-off. As mobile devices such as a cellular phone, a PDA digital camera, a portable game console, and an MP3P are being used increasingly, the flash memory device is used more widely as a code storage as well as a data storage. The flash memory device may be also used in home applications such as a HDTV, a DVD, a router, and a GPS.

Figure 15:
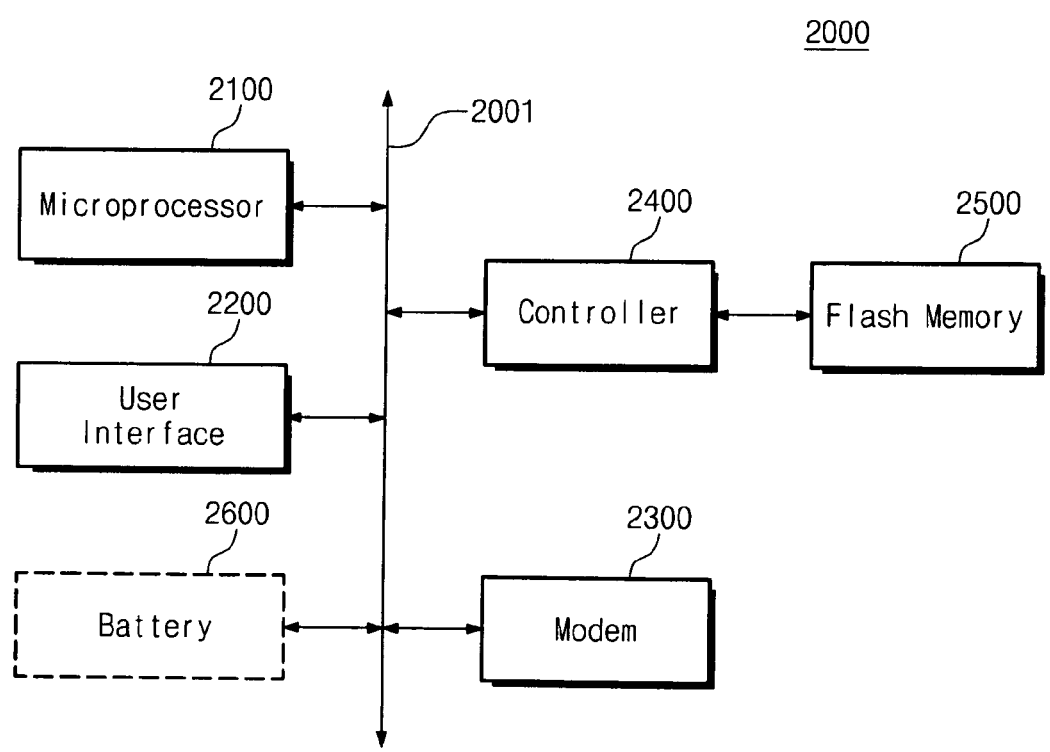
FIG. 15 is a block diagram depicting a computing system including a memory system of the present invention.

A computing system including the memory system according to the present invention is illustrated in FIG. 15 in brief. The computing system of the present invention includes a microprocessor 2100 electrically connected to a bus 2001, a user interface 2200, a modem 2300, for example, a baseband chipset, a memory controller 2400, and a flash memory device 2500. The memory controller 2400 corresponds to the memory controller of FIG. 1, and the flash memory device 2500 is configured essentially identical to that of FIG. 1. N-bit data (N is 1 or a larger number) processed/to-be-processed by the microprocessor 2100, is stored in the flash memory device 2500 by the microprocessor 2100. In case the computing system according to the present invention is a mobile device, a battery 2600 for supplying an operation voltage of the computing system is further provided. Although not shown in drawing, it will be obvious to a person in the art that an application chipset, a camera image processor (CIS), or a mobile DRAM may be further included in the computing system of the present invention. The memory controller 2400 and the flash memory device 2500 may form, for example, a solid state drive/disk (SSD) using a nonvolatile memory for storing data, or may form a nonvolatile memory as a memory card.

Figure 16:
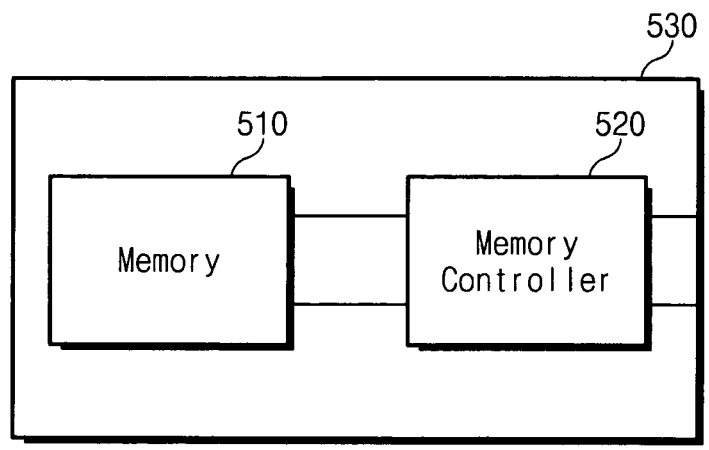
FIG. 16 is a block diagram depicting a memory system according to other exemplary embodiments of the present invention.

FIG. 16 is a block diagram depicting a memory system according to other exemplary embodiments of the present invention.

The memory system depicted in FIG. 16 is similar to that in FIG. 3, except that a memory 510 and a memory controller 520 form a card 530. For example, the card 530 may be a memory card, e.g., a flash memory card. In other words, the card 530 may be a card that conforms to an industrial standard so as to use an electrical device, for example, a digital camera, or a personal computer. It should be understood that the memory controller 520 may control the memory 510 based on the control signals received from another device (e.g., an external device).

Figure 17:
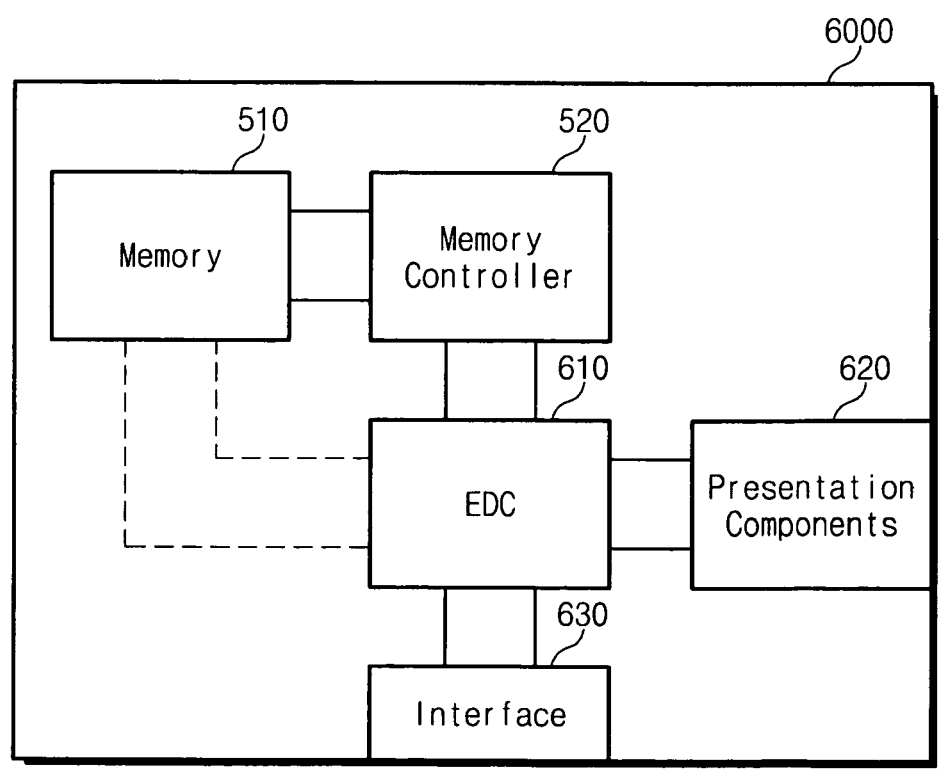
FIG. 17 is a block diagram depicting a memory system according to other exemplary embodiments of the present invention.

FIG. 17 is a block diagram depicting a memory system according to other exemplary embodiments of the present invention.

The system in FIG. 17 depicts a portable device 6000. The portable device 6000 may be an MP3 player, a video player, a combination video and audio player, and the like. The portable device 6000 includes a memory 510 and a memory controller 520. The portable device 6000 may also include an encoder/decoder 610, presentation components, and an interface 630.

Data (for example, video or audio) processed by the encoder/decoder (EDC) 610 may be inputted to and outputted from the memory 510 via the memory controller 520. As shown in dotted lines in FIG. 16, data is directly inputted from the EDC 610 to the memory 510 and/or directly outputted from the memory 510 to the EDC 610.

The EDC 610 may encode data to store in the memory 510. For example, the EDC 610 may perform an MP3 encoding on audio data to store in the memory 510. Alternatively, the ECD 610 may perform an MPEG encoding (e.g., MPEG2, MPEG4) on video data to store in the memory 510. Also, the ECD 610 may include a plurality of encoders to encode other types of data in accordance with other data formats. For example, the EDC 610 may include a MP3 encoder for audio data and a MPEG encoder for video data.

The EDC 610 may decode an output from the memory 510. For example, the EDC 610 may perform an MP3 decoding on the audio data outputted from the memory 510. Alternatively, the EDC 610 may perform an MPEG decoding (for example, MPEG2 and MPEG4) on the video data outputted from the memory 510. Or, the EDC 610 may include a plurality of decoders for decoding other types of data according to other data formats. For example, the EDC 610 may include an MP3 decoder for audio data and an MPEG decoder for video data.

The EDC 610 may include only the decoders. For example, an already encoded data may be received by the EDC 610 and may be passed to the memory controller 520 and/or the memory 510.

The EDC 610 may receive data for encoding or the already encoded data via the interface 630. The interface 630 may conform to a well-known standard (e.g., firmware, USB). The interface 630 may include one or more interfaces, for example, a firmware interface or a USB interface. Data from the memory 510 may be outputted through the interface 630.

The presentation components 620 may be outputted from the memory and/or may display for a user the decoded data by the EDC 610. For example, the presentation components 620 may include a speaker jack, or a display screen that outputs video data.

Figure 18:
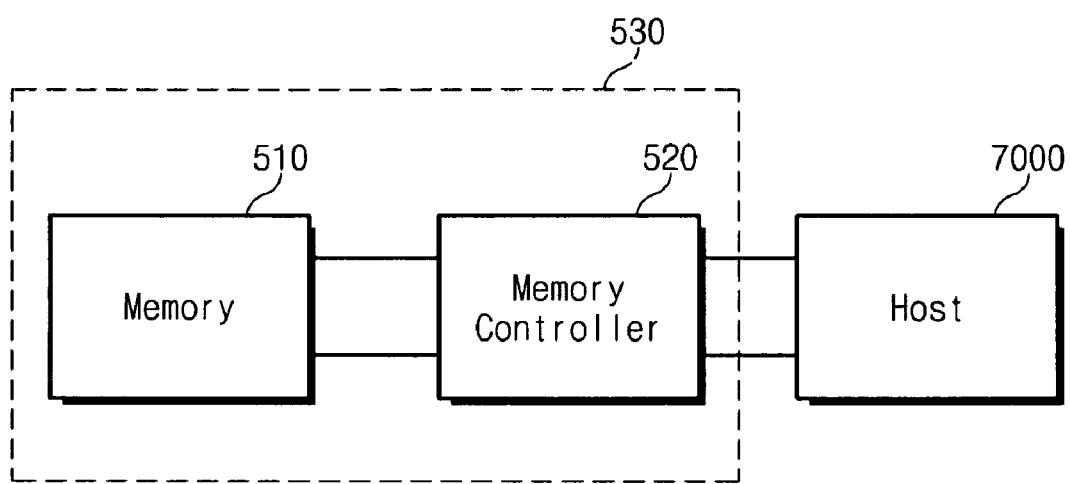
FIG. 18 depicts exemplary embodiments of a host system connected to a card illustrated in FIG. 16.

FIG. 18 depicts exemplary embodiments of a host system 7000 connected to a card 530 of FIG. 16. In the exemplary embodiments, the host system 7000 may supply control signals so that the memory controller 520 may control operation of the memory 510.

The flash memory device and/or the memory controller according to the present may be mounted using various forms of packages. For example, the flash memory device and/or the memory controller may be mounted using packages, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

Although the present invention has been described in connection with the example embodiments of the present invention illustrated in the accompanying drawings, it is not limited thereto. Persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of operating a nonvolatile memory device, the method comprising:
   repetitively programming at least one page included in a selected memory block of the nonvolatile memory device until a program pass;
   reading a loop number of the programmed page from the nonvolatile memory device;
   comparing the read loop number to a particular value; and
   determining the selected memory block of the nonvolatile memory device to be invalid according to the comparison result.

2. A method of claim 1, wherein the particular value is a lower loop number, and the selected memory block is determined to be invalid when the read loop number is smaller than the lower loop number.

3. A method of claim 1, wherein the particular value is an upper loop number, and the selected memory block is determined to be invalid when the read loop number is larger than the upper loop number.

4. A method of claim 1, wherein the particular value is adjusted based on wear-leveling information of the selected memory block.

5. A method of claim 1, wherein the particular value is a lower loop number, and the determining the selected memory block of the nonvolatile memory device to be invalid comprises:
   distinguishing whether data of the programmed page exceeds an error correction range or not, if the read loop number is smaller than the lower loop number; and
   determining the selected memory block to be invalid if the data of the programmed page is distinguished to exceed the error correction range, or determining the selected memory block to be valid if the data of the programmed page is distinguished not to exceed the error correction range.

6. A method of claim 1, wherein the particular value is an upper loop number, and the determining the selected memory block of the nonvolatile memory device to be invalid comprises:
   distinguishing whether data of the programmed page exceeds an error correction range or not, if the read loop number is larger than the upper loop number; and
   determining the selected memory block to be invalid if the data of the programmed page is distinguished to exceed the error correction range, or determining the selected memory block to be valid if the data of the programmed page is distinguished not to exceed the error correction range.

7. A nonvolatile memory device comprising:
- a memory cell array including a plurality of memory blocks, each of the plurality memory blocks having a plurality of pages;
- a read/write circuit configured to repetitively program a selected page among a selected memory block until a program pass; and
- a control logic configured to control the read/write circuit and count a loop number of the programmed page,
- wherein the memory cell array is configured to store reference loop information which is based on wear-level information of the memory cell array, and the selected memory block is determined to be invalid according to a result of comparing the counted loop number to the reference loop information.

8. The nonvolatile memory device of claim 7, wherein the comparing operation is performed after the program pass.

9. The nonvolatile memory device of claim 7, wherein the reference loop information is a lower loop number corresponding to each of the plurality of memory blocks, the selected memory block is determined to be invalid when the counted loop number is smaller than the lower loop number.

10. The nonvolatile memory device of claim 7, wherein the reference loop information is an upper loop number corresponding to each of the plurality of memory blocks, and the selected memory block is determined to be invalid when the counted loop number is larger than the upper loop number.

11. A nonvolatile memory system comprising:
- a nonvolatile memory device including a plurality of memory blocks, each of the plurality of memory blocks having a plurality of pages; and
- a memory controller configured to manage wear-leveling information of the nonvolatile memory device, and generate reference loop information according to the wear-leveling information, wherein
- the nonvolatile memory device is configured to program a selected page in a selected memory block and provide a loop number of the programmed page to the memory controller, and
- the memory controller is configured to compare the loop number to the reference loop information and determine the selected memory block to be invalid according to the comparison result.

12. The nonvolatile memory system of claim 11, wherein the nonvolatile memory device is configured to provide the loop number to the memory controller after a program pass.

13. The nonvolatile memory system of claim 11, wherein the memory controller includes a memory storing the generated reference loop information.

14. The nonvolatile memory system of claim 11, wherein the memory controller is configured to check a program and erase cycle of the each of the plurality of memory blocks and manage the wear-leveling information according to the program and erase cycle.

15. The nonvolatile memory system of claim 11, wherein the reference loop information is a reference loop range corresponding to each of the plurality of memory blocks, the reference loop range having a lower loop number and an upper loop number.

16. The nonvolatile memory system of claim 15, the memory controller is configured to determine the selected memory block to be invalid according to whether the loop number is out of the reference loop range.

17. The nonvolatile memory system of claim 11, wherein the reference loop information is a particular value corresponding to each of the plurality of memory blocks.

18. The nonvolatile memory system of claim 17, wherein the particular value is a lower loop number, and the memory controller is configured to determine the selected memory block to be invalid when the loop number is smaller than the lower loop number.

19. The nonvolatile memory system of claim 18, wherein the particular value is an upper loop number, and the memory controller is configured to determine the selected memory block to be invalid when the loop number is larger than the upper loop number.

20. The nonvolatile memory system of claim 11, wherein the memory controller is configured to store the reference loop information into the nonvolatile memory device.

21. The nonvolatile memory system of claim 20, wherein the memory controller is configured to load the reference loop information from the nonvolatile memory device upon power-up.

* * * * *